(12) United States Patent
Zeng

(10) Patent No.: US 7,992,061 B2
(45) Date of Patent: Aug. 2, 2011

(54) METHOD FOR TESTING RELIABILITY OF SOLID-STATE STORAGE MEDIUM

(75) Inventor: Wen-Jun Zeng, Keelung (TW)

(73) Assignee: Industrial Technology Research Institute, Hsinchu (TW)

( * ) Notice: Subject to any disclaimer, the term of this patent is extended or adjusted under 35 U.S.C. 154(b) by 193 days.

(21) Appl. No.: 12/372,692

(22) Filed: Feb. 17, 2009

(65) Prior Publication Data

US 2010/0125767 A1 May 20, 2010

(30) Foreign Application Priority Data

Nov. 18, 2008 (TW) .............................. 97144536 A

(51) Int. Cl.
*G11C 29/00* (2006.01)
*G11C 11/34* (2006.01)
*G11C 16/04* (2006.01)
*G06F 11/00* (2006.01)

(52) U.S. Cl. ........... 714/723; 714/6.1; 714/54; 714/773; 365/185.29; 365/185.3; 365/185.33

(58) Field of Classification Search ................. None
See application file for complete search history.

(56) References Cited

U.S. PATENT DOCUMENTS

| | | | |
|---|---|---|---|
| 5,490,109 A * | 2/1996 | Salmon ................. | 365/185.17 |
| 6,622,199 B1 * | 9/2003 | Spall et al. ............ | 711/103 |
| 2008/0046649 A1* | 2/2008 | Ito ....................... | 711/115 |
| 2009/0268521 A1* | 10/2009 | Ueno et al. ............ | 365/185.11 |
| 2010/0064096 A1* | 3/2010 | Weingarten et al. .... | 711/103 |
| 2010/0115189 A1* | 5/2010 | Lin et al. ............... | 711/103 |

* cited by examiner

*Primary Examiner* — Cynthia Britt
*Assistant Examiner* — Guerrier Merant
(74) *Attorney, Agent, or Firm* — Jianq Chyun IP Office

(57) ABSTRACT

A method for testing a reliability of a solid-state storage medium is provided, wherein the solid-state storage medium has a plurality of blocks. First, a lifetime of each of the blocks of the solid-state storage medium is obtained. Then, an erase count of each of the blocks is obtained, and whether the erase count is greater than a predetermined erase count is determined. After that, those blocks having their erase counts greater than the predetermined erase count are accumulated to generate a problematic block number, and a test report is output.

14 Claims, 7 Drawing Sheets

| number | ECC | Endu |
|---|---|---|
| 0-9999 | 0 | 0 |
| 0-19999 | 0-2 | 1 |
| 0-49999 | 0-4 | 2 |
| 0-Max | no defect | 3 |

METHOD FOR TESTING RELIABILITY OF SOLID-STATE STORAGE MEDIUM

CROSS-REFERENCE TO RELATED APPLICATION

This application claims the priority benefit of Taiwan application serial no. 97144536, filed Nov. 18, 2008. The entirety of the above-mentioned patent application is hereby incorporated by reference herein and made a part of specification.

BACKGROUND OF THE INVENTION

1. Field of the Invention

The present invention generally relates to a test method, and more particularly, to a test method for a storage device.

2. Description of Related Art

Solid-state drives (SSDs) composed of flash memories are becoming increasingly popular in the market. A flash memory is a non-volatile memory that can be electrically programmed and erased. However, the lifetime of a flash memory is limited by of its erase cycles. Thus, when using a SSD composed of flash memories, the reliability of the memory system becomes very important. However, the reliability of a SSD has to be tested by using a client-side test tool.

Presently, there is no any standard method for testing the reliability of a SSD, while the test methods used by different manufacturers can not provide a comprehensive test to the reliability of a SSD. For example, in some existing SSD test methods, the erase bytes/write bytes ratio or the ratio of reduced erase cycles when cache and hot data are accessed is used for indicating the overhead of wear levelling. In some other methods, the reliability of a SSD is determined based on the erase count of the SSD (i.e., by counting the erase cycles of the SSD). Another method is to use an erase count standard deviation and an average value for indicating the overhead of wear levelling, namely, the overall erase count and divergence degree thereof.

In addition, most existing test methods are executed based on an entire storage medium, and accordingly the test report thereof has very low resolution. The test result will be more reliable if the test is performed in unit of blocks. Moreover, in most existing test methods, erase count is the only factor taken into consideration and accordingly errors can be produced in the test result.

SUMMARY OF THE INVENTION

Accordingly, the present invention is directed to a test method for a solid-state storage medium, and thus the reliability and practicality of the test method are improved.

The present invention provides a method for testing the reliability of a solid-state storage medium, and the solid-state storage medium has a plurality of blocks. First, a lifetime of each of the blocks of the solid-state storage medium is obtained. Then, an erase count of each of the blocks is obtained, and whether the erase count is greater than a predetermined erase count is determined. Next, those blocks having their erase counts greater than the predetermined erase count are accumulated to generate a problematic block number, and a test report is output.

The present invention further provides a method for testing the reliability of a solid-state storage medium, and the solid-state storage medium has a plurality of blocks. First, a test process is determined. Then, the data of a test item is sent by the solid-state storage medium to a host through an interface command. A data difference of the test item before and after the test process is obtained to output a test report. The test item can be an erase count, an error correction code (ECC) endurance, or an invalid page of each of the blocks.

In the present invention, data of different test items can be initiatively obtained from a solid-state storage medium through an interface command between a host system and the solid-state storage medium to generate a test report. Since these test items are executed in unit of blocks, the reliability and practicality of the test report of the solid-state storage medium are effectively improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
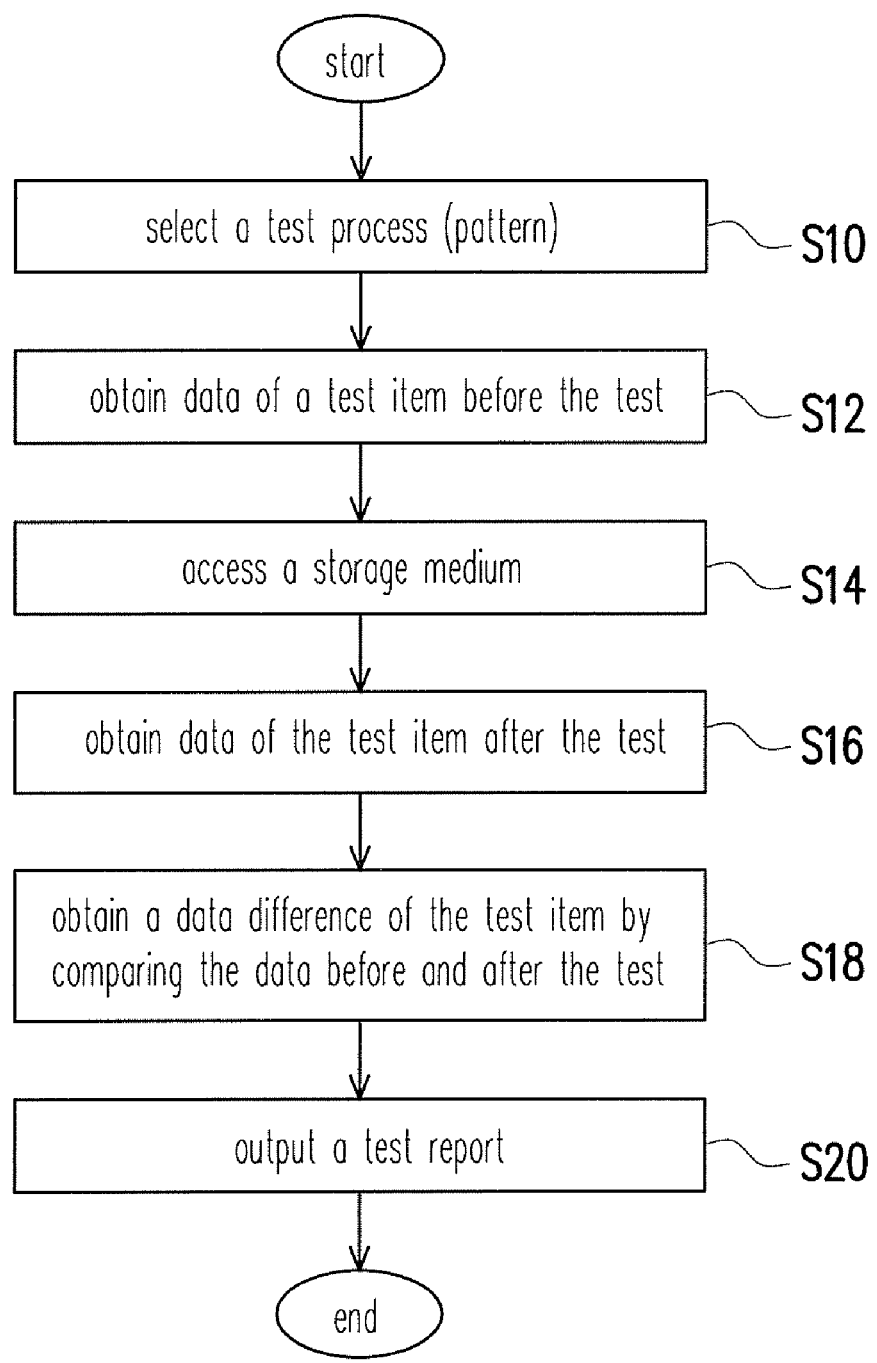
FIG. 1A is a flowchart of a test method according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

According to the present invention, a test report is to be obtained through the test of a solid-state storage medium. Herein the test report is in a technical standard language (for example, mean time between failures (MTBF) and long-term data endurance (LDE), etc) commonly adopted in the market or industry.

Figure 1B:
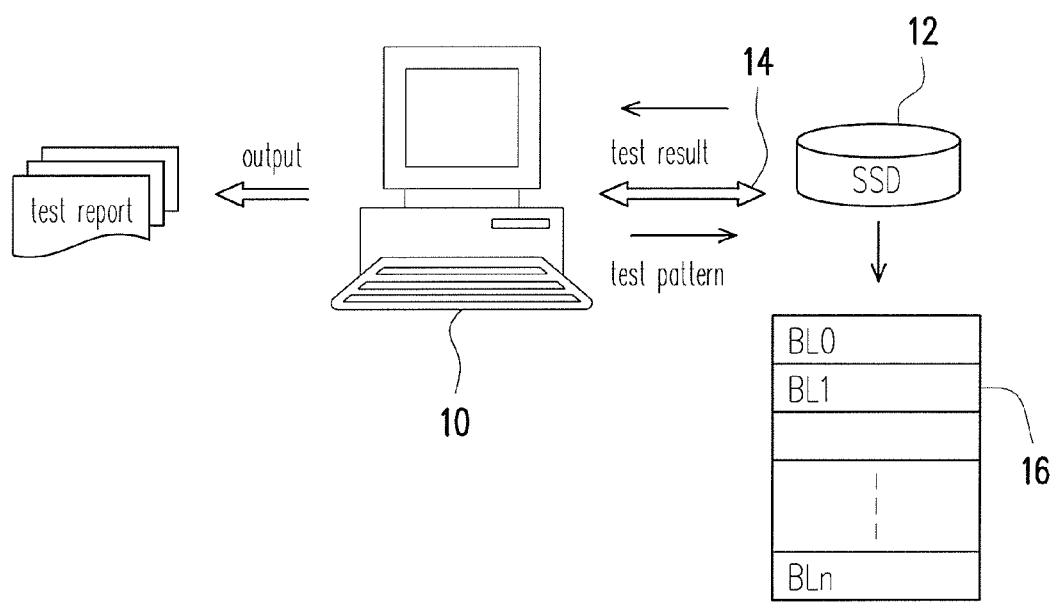
FIG. 1B is a schematic diagram of an application system of the test method.

FIG. 1A is a flowchart of a test method according to an embodiment of the present invention, and FIG. 1B is a schematic diagram of an application system of the test method. First, in step S10, a test process (or pattern) is selected for testing a storage medium. In the present embodiment, a solid state drive (SSD) composed of flash memories will be taken as an example of the storage medium. For example, as shown in FIG. 1B, a user sends various test processes from a computer (system end) 10 to the SSD 12 through an interface 14. The interface 14 can be an ATA interface, a SATA interface, or any other suitable interface. In the present embodiment, the SSD 12 is composed of a flash memory, and the flash memory comprises a number of blocks (BL0~BLn) 16.

In step S12, before starting the test, data of the SSD corresponding to a test item is obtained through the interface 14.

This step can also be executed before the test process is selected. Next, in step S14, the SSD 12 is accessed according to the test process (or pattern) selected in step S10.

Next, in step S16, the desired test item (i.e., data obtained through different test methods provided by the present invention) is read through a self-defined interface command after the test has been carried out for some time. After that, in step S18, the data obtained before and after the test is compared to obtain a difference value. Finally, in step S20, if necessary, the test result is converted into a test report.

The test process (or pattern) in step S10 can be performed through following methods. First, actual or simulated read/write operations can be performed to the SSD. Different procedure can be adopted according to different operating system (for example, Windows, Unix/Linux, or Mac, etc), different user characteristic and platform (for example notebook computer, PC, or server, etc), and different application (for example, database or monitoring system, etc).

Next, the test process can also be carried out with a special pattern. This is to perform aggressive tests regarding operations which may reduce the performance of the SSD. For example, the test is carried out by writing a great number of small files into the SSD, writing data into the SSD when the SSD is almost full, or accessing the SSD sequentially/randomly, etc. In addition, aggressive tests may be performed regarding side effects produced by different SSD techniques. For example, a SSD with a multi-channel structure is tested by alternatively writing a greater number of small files and a small number of large files.

In addition, a stress test can also be performed; namely, the SSD is intensively accessed for long a time. Test processes described above are only some possible examples of the present invention, but not for limiting the present invention, and other test processes can also be applied to the present invention without departing from the spirit and scope of the present invention.

The present invention focuses on the method used for testing the SSD. The test method provided by the present invention will be further described below. The test method can be carried out regarding block erase count, test error, hidden error, ECC endurance, and invalid page number of the flash memory in the SSD. Different test methods will be respectively described below.

Figure 2:
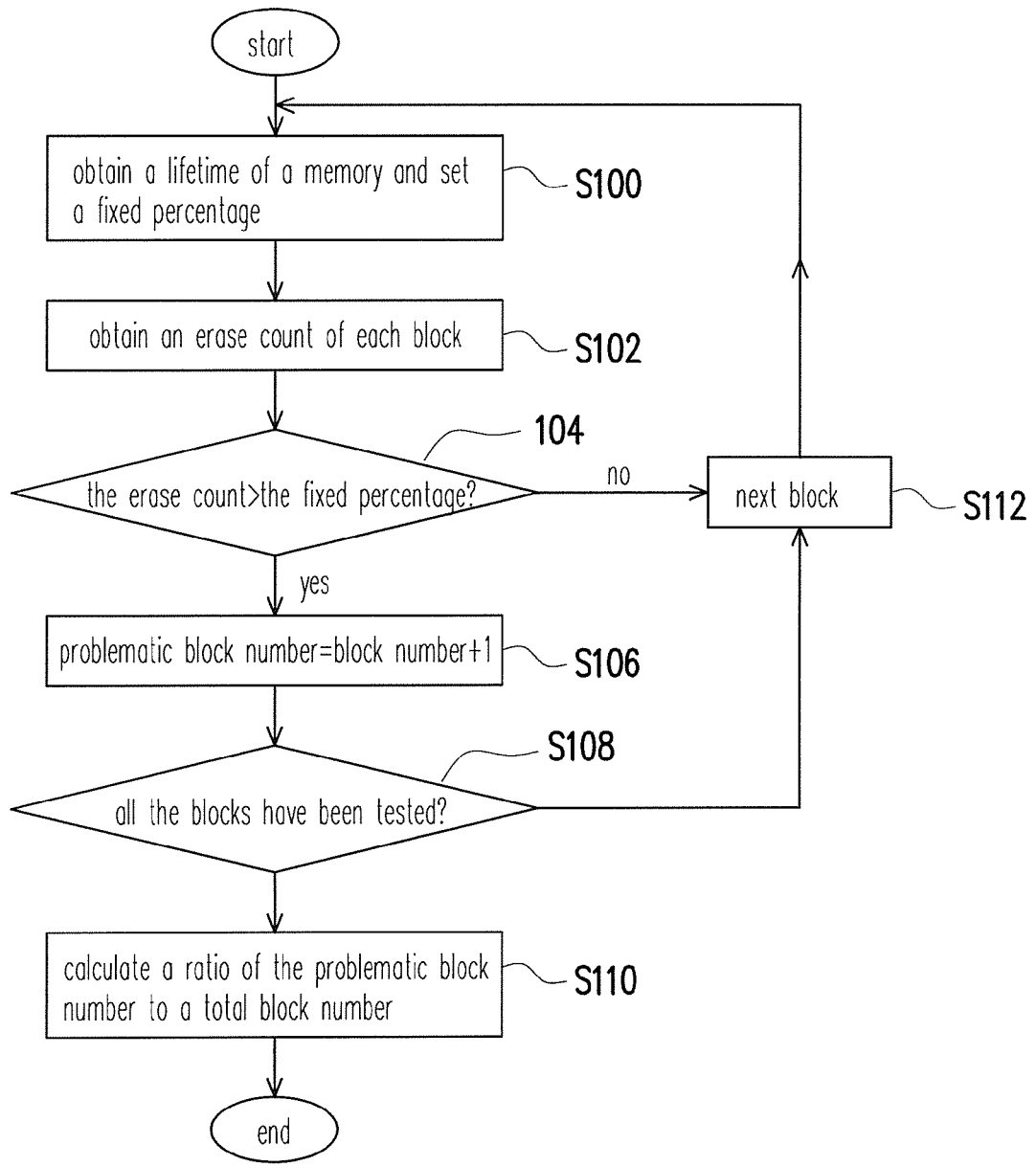
FIG. 2 is a flowchart of a test method according to an embodiment of the present invention.

FIG. 2 is a flowchart of a test method according to an embodiment of the present invention. The test item adopted in the present embodiment is to calculate a ratio of the erase counts of the blocks in each flash memory of the solid-state storage medium to a total block number of the solid-state storage medium and evaluate the state of the solid-state storage medium according to this ratio.

Referring to both FIG. 2 and FIG. 1B, first, in step S100, a lifetime of each block in the flash memory of the solid-state storage medium is obtained through an interface (for example, an ATA interface), and a fixed percentage (for example, 90%) is set. The lifetime of the block can be the total number that the block can be erased, and the fixed percentage indicates that whether the block is already erased for more than a predetermined erase count. When the erase count of the block exceeds the predetermined erase count (i.e., the fixed percentage), the reliability of the block becomes very low, and the system will avoid writing data into this block.

Then, in step S102, the erase count of the block is obtained. Namely, the number that the block is already erased is obtained. Next, in step S104, whether the erase count is greater than the predetermined erase count corresponding to the fixed percentage is determined. If the erase count is not greater than the predetermined erase count, the block is determined to have a high reliability, and in this case, step S112 is executed to test the next block.

In contrast, if the erase count is greater than the predetermined erase count corresponding to the fixed percentage, the bock is determined to have a low reliability. In this case, step S106 is executed to increase a problematic block number by 1.

After that, in step S108, whether all the blocks have been tested is determined. If there is still untested block, step S112 is executed to text the next block; otherwise, if all the blocks have been tested, step S110 is executed to calculate a ratio of the problematic block number to the total block number. After that, the ratio is output as a test result such that the user can get to know about the reliability of the solid-state storage medium.

In the embodiment described above, an extreme situation that each block has a different lifetime is assumed. Thus, the process returns to step S100 from step S112 to obtain the lifetime of the next block. If conditions of the fabrication process of the memory are well controlled and accordingly the lifetimes of all the blocks are almost identical, the process can go from step S112 directly to step S102; namely, the lifetimes of the blocks are obtained only once.

In addition, the lifetimes of the blocks can be obtained through commands pre-defined in the SSD (in the present embodiment, ATA commands), wherein the SSD reports the lifetimes of its memories automatically. Or, the lifetimes of the blocks can also be input by a user. In addition, whether the erase count of a block is greater than the predetermined erase count (the fixed percentage) may also be determined through an interface command.

Through the test method illustrated in FIG. 2, the lifetime of each block can be accurately obtained. Compared to the conventional technique that only the overall erase count is tested, the test method in the present embodiment is more accurate and reliable.

Figure 3:
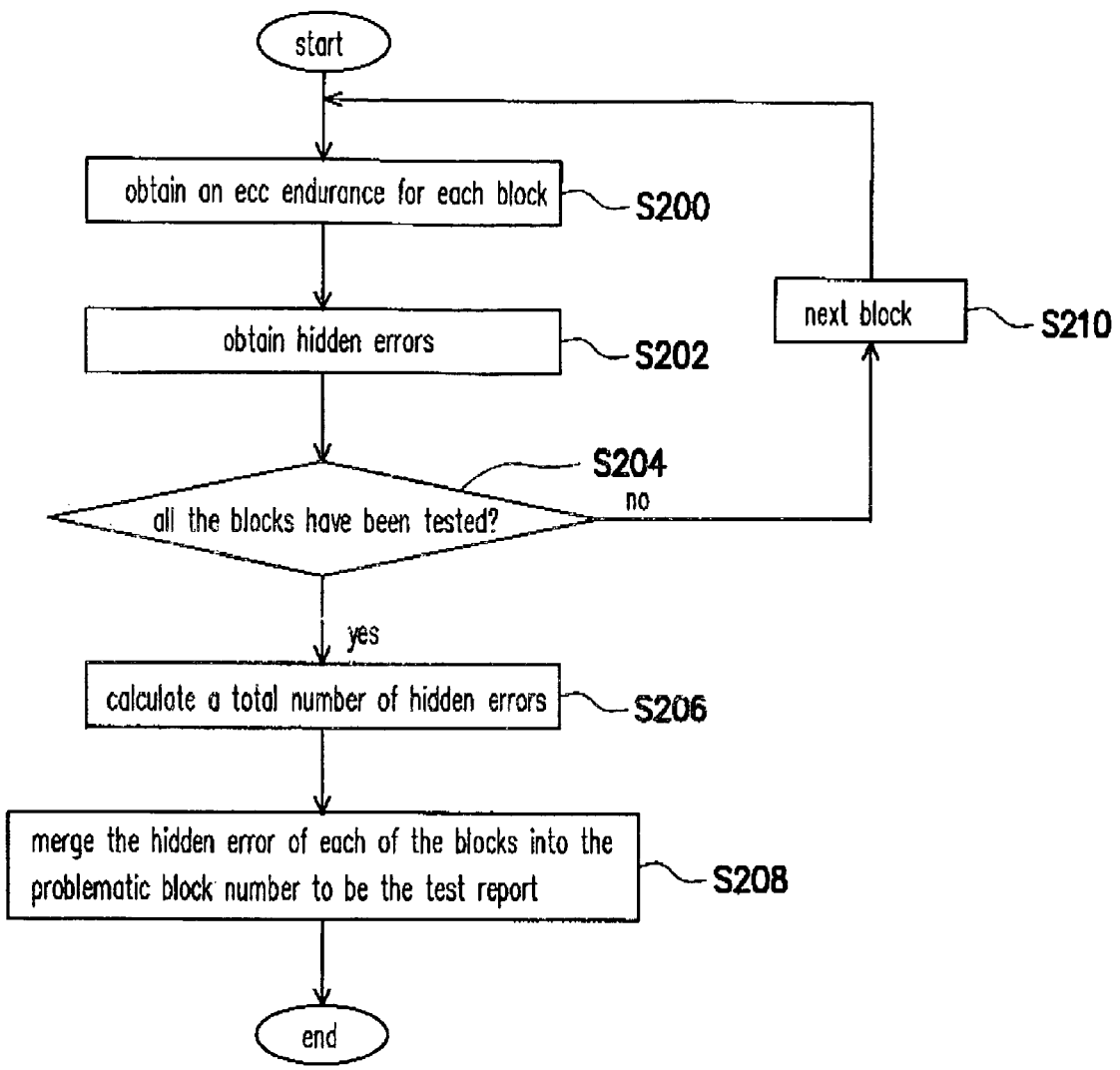
FIG. 3 is a flowchart of another test method according to an embodiment of the present invention.

FIG. 3 is a flowchart of a test method according to another embodiment of the present invention. In the present embodiment, the reliability of a solid-state storage medium is tested based on an error correction code (ECC) endurance of each block in the memory of the solid-state storage medium. The ECC endurance will be described in detail below. Basically, an ECC endurance of a block represents a hidden error probability of the block. The reliability and practicality of a test report are further improved by adopting the hidden error of a block as a test item.

As shown in FIG. 3, in step S200, an ECC endurance of each block is obtained through an interface command. Then, in step S202, a number of hidden errors (i.e., the variation of the ECC endurance) is obtained.

Then, in step S204, whether all the blocks have been tested is determined. If there is still untested block, step S210 is executed to obtain the ECC endurance of the next block; otherwise, if all the blocks have been tested, in step S206, a total number of hidden errors is calculated. Then, at step S208, the total number of hidden of the hidden error of each of the blocks can be merged into the problematic block number to be the test report.

The method illustrated in FIG. 3 can be combined with the method illustrated in FIG. 1; namely, the erase count of each block is taken into consideration to determine the lifetime of the block more precisely.

Figure 4:
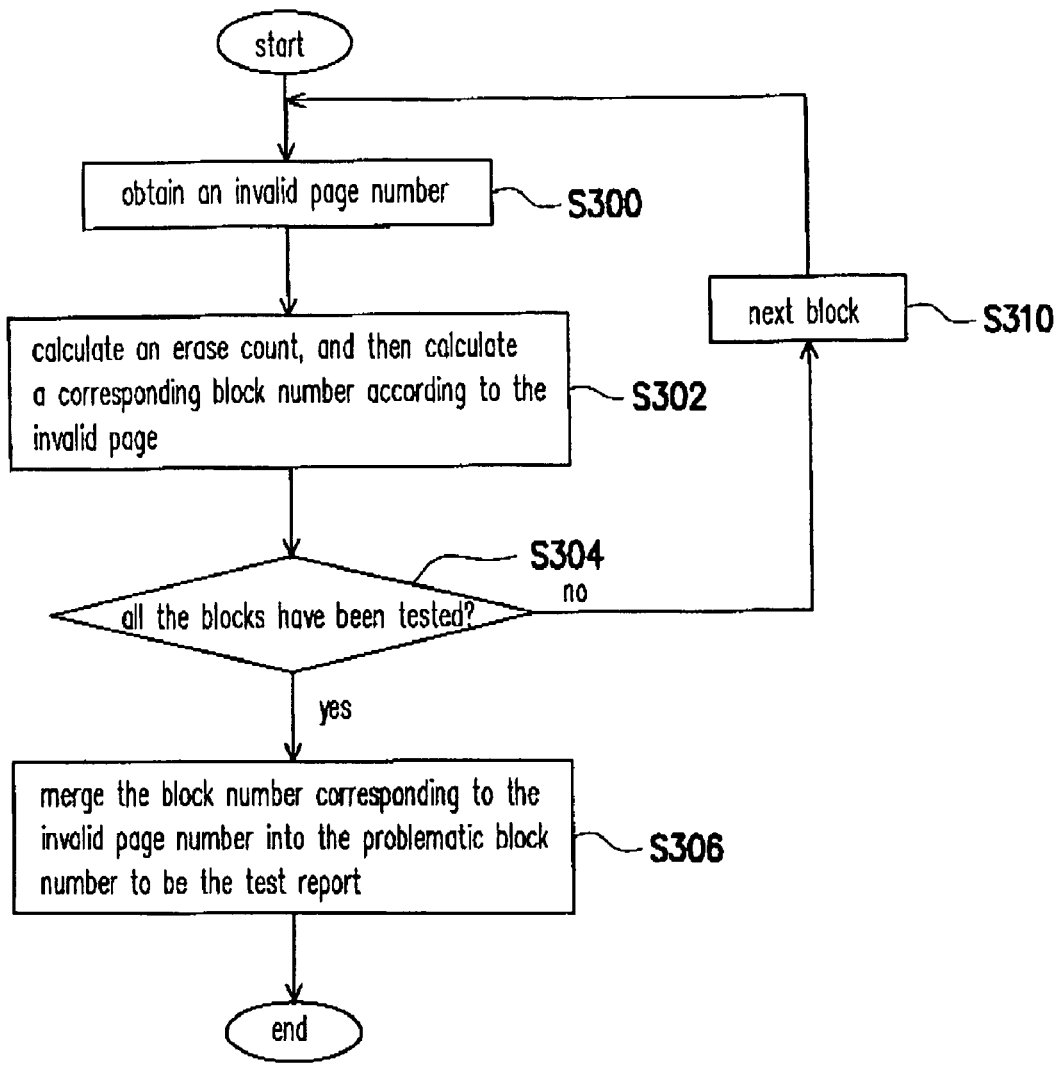
FIG. 4 is a flowchart of a test method according to another embodiment of the present invention.

FIG. 4 is a flowchart of a test method according to another embodiment of the present invention. In the present embodiment, an invalid page number is adopted as the test item. In this method, the difference in erase count obtained when the garbage collection (a memory management method) is performed before or after the test is avoided. The existence of invalid pages affects the reliability of the solid-state storage medium. Thus, the invalid pages have to be taken into consideration along with the erase count so as to improve the reliability of the test result.

For example, if a block has 256 more invalid pages and each block contains 128 pages, the total erase count should be increased by 256/128 (i.e., 2).

As shown in FIG. 4, in step S300, the invalid page number of a block is obtained through an interface command, and the corresponding erase count is calculated. Then, in step S302, those blocks having their erase counts greater than a predetermined erase count are obtained (for example, the test process in FIG. 2), so as to calculate a corresponding block number according to the invalid page number. In step S304, whether all the blocks have been tested is determined. If there is still untested block, step S310 is executed to test the next block. Otherwise, when all the blocks have been tested, step S306 is executed to calculate a problematic block number. The problematic block number further contains the block number corresponding to the invalid pages besides the block number calculated through the process in FIG. 2. Namely, at step S306 the block number corresponding to the invalid page number is merged into the problematic block number to be the test report.

The test on the reliability of the solid-state storage medium is made more accurate and practical by taking the invalid pages into consideration.

The foregoing processes illustrated in FIGS. 2~4 can be executed together for testing the reliability of a solid-state storage medium, or the test of ECC endurance or invalid pages can be added to the test of the erase count. In addition, in foregoing three test methods, the SSD (solid-state storage medium) can automatically report the lifetime of its flash memory, the number of blocks having their erase counts greater than a specific fixed percentage, the total number of blocks, the maximum erase count through interface commands pre-defined in the SSD (the solid-state storage medium).

Figure 5:
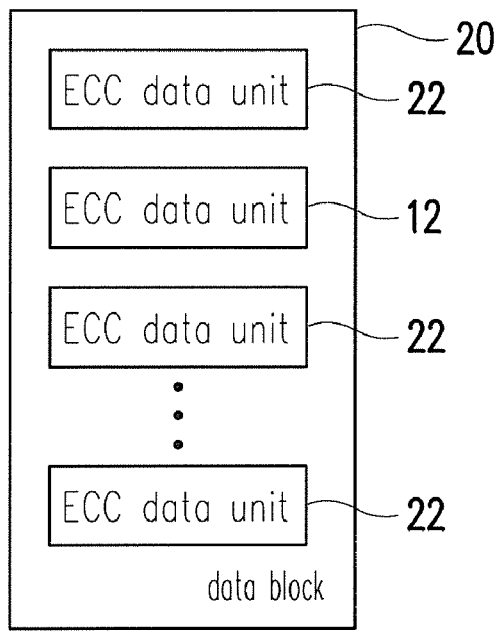
FIG. 5 is a schematic diagram of a data block containing error correction code (ECC) data units.

Thereafter, the aforementioned ECC endurance will be described herein. FIG. 5 is a schematic diagram of a data block containing a plurality of ECC data units. In the present embodiment, a flash memory will be taken as an example. Data in the flash memory is accessed in unit of data blocks (as the data blocks 20 in FIG. 5). A data block 20 usually contains one or more ECC data blocks 22. As the smallest read/write unit, the size of a data block 20 may be 512 B or 2 KB, and which can be appropriately adjusted according to the actual design. Each of the ECC data blocks 22 contains data of an adjustable bit number, such as 16 bits. An ECC process can be performed to the data to be read or written through the ECC data blocks 22.

Each ECC data block has a detectable error bit number and a correctable error bit number. In addition, each data block 20 also has a detectable error bit number and a correctable error bit number (i.e., a total of the detectable error bit numbers and a total of the correctable error bit numbers of all the ECC data blocks 22 in the data block 20).

Figure 6:
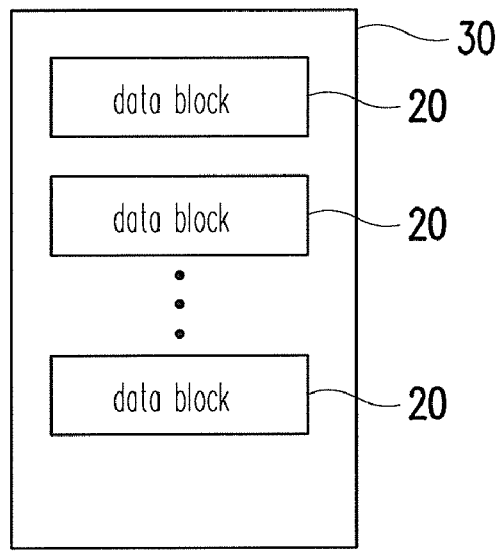
FIG. 6 is a schematic diagram of an endurance block according to an embodiment of the present invention.

FIG. 6 is a schematic diagram of an endurance block according to an embodiment of the present invention. Referring to FIG. 6, in the present embodiment, the endurance block 30 in the flash memory may contains a plurality of data blocks 20 as shown in FIG. 5. In the flash memory, the wear of the flash memory is recorded and calculated in unit of endurance blocks.

According to the present embodiment, data or files stored in the flash memory are categorized according to their significances, and different endurances Endu are assigned to the endurance blocks 30. Namely, a reference tag is attached to each storage area in the flash memory for indicating the wear of the storage area, so that the endurance of the block can be predicted. For example, the endurance Endu can be assigned a value of 0, 1, 2, or 3 according to the probability of error occurrence. The smaller value the endurance Endu has, the higher the reliability of the storage area is, and accordingly the more suitable the storage area is for storing files or data of higher significance. Through the method described above, the reliability of each storage area in the memory can be predicted, and data or files of higher significance can be stored in the storage area having higher reliability. The method for determining the reliability of each storage area in the memory will be described in detail below.

In foregoing method for categorizing data or files according to their significances, the data or files can be categorized by the system according to the attributes and extensions thereof, or the significances of the data or files may also be defined by a user. After the data or files are categorized, the data or files can be stored into corresponding blocks having different endurances according to their significances.

For example, if the files or data are categorized by the system, those files which are highly related to the operating system, such as system files and hidden files, are stored into an area having Endu=0, data files are stored into an area having Endu=1, and video/audio files are stored in an area having Endu=2, and backup files are stored in an area having Endu=1.

Additionally, if the files or data are categorized by a user, important data or video/audio files are stored in an area having Endu=0, general data and video/audio files are stored in an area having Endu=1, and non-important data or video/audio files are stored in an area having Endu=3. However, foregoing descriptions are only examples of the present invention, and how to map data of different significances to areas having different Endu values should be determined according to the definition of the system or the user.

Figures 7, 8:
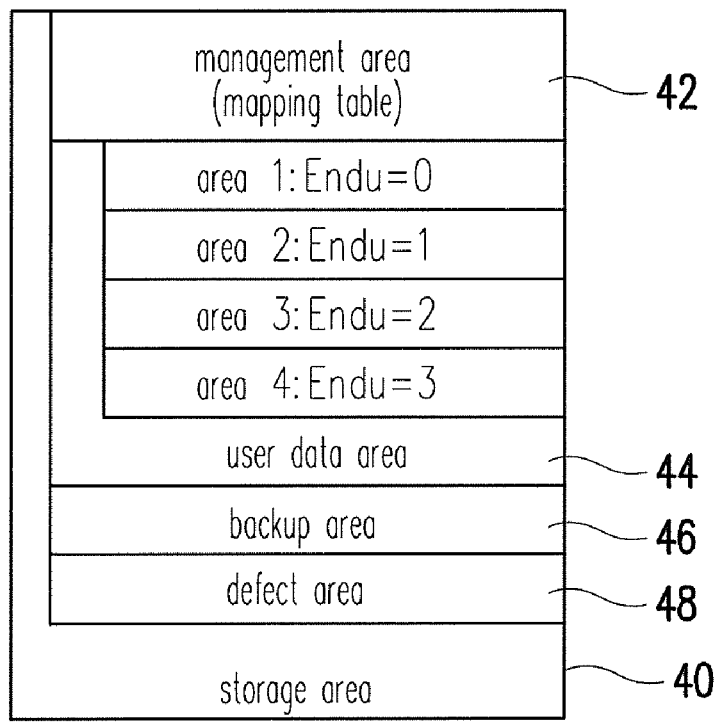
FIG. 7 is a schematic diagram illustrating storage areas in a memory according to an embodiment of the present invention.
FIG. 8 is a schematic diagram of an endurance table in a management area according to an embodiment of the present invention.

FIG. 7 is a schematic diagram illustrates various storage areas in a memory according to an embodiment of the present invention. As shown in FIG. 7, an example of disposition of logic storage areas in a memory is illustrated. For example, a storage area 40 is divided into a management area (mapping table) 42, a user data area 44, a backup area 46, and a defect area 48. As shown in FIG. 7, the user data area 44 is further divided into areas 1~4 according to the endurances Endu of the areas, and data or fines are stored into these areas according to their significances.

An endurance table can be stored in the management area 42. The endurance table records the positions, write cycles, ECC bit numbers, and endurances Endu (i.e., probabilities of error occurrence) of endurance blocks. FIG. 8 is a diagram of an endurance table in a management area according to an embodiment of the present invention. As shown in FIG. 8, the endurance Endu can be a function of an expression of erase count and ECC. Generally, a flash memory is assigned with an erase/write (E/W) reference value i.e., how many times the flash memory can be erased/written) and a distribution (how many times the flash memory can be erased/written before defect is produced) when the flash memory is just manufactured. A corresponding function or expression is defined by using the E/W reference value, the ECC, and the distribution so as to calculate the endurance Endu by using the erase count and the ECC. The corresponding function or expression can be expanded along with the increase in number of read/write cycles and can be adjusted according to the current situation and wear of the flash memory.

Based on foregoing endurance table, a storage area can be divided into a plurality of areas; namely, foregoing endurance blocks, according to different endurances Endu thereof. As shown in FIG. 3, the area is divided into areas 1~4 according to the endurances Endu 0~3.

Besides, the corresponding function or expression of the endurance Endu may also be adjusted according to the numbers of files of different significances. In addition, the management area 42 can be implemented by using a highly reliable storage medium (for example, a MRAM) because of its high significance.

As described above, in the present invention, data of various test items can be initiatively obtained from a solid-state storage medium through interface commands between a host system and the solid-state storage medium to generate a test report. Since each test item is executed in unit of blocks, both the practicality and reliability of the test report of the solid-state storage medium are improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for testing a reliability of a solid-state storage medium, wherein the solid-state storage medium comprises a plurality of blocks, the method comprising:
   obtaining a lifetime of each of the blocks of the solid-state storage medium;
   obtaining an erase count of each of the blocks for each erase;
   determining whether the erase count of each of the blocks is greater than a predetermined erase count;
   accumulating the blocks having the erase counts greater than the predetermined erase count to generate a problematic block;
   calculating a ratio of the problematic block number to a total block number of the solid-state storage medium, and using the ratio as a test report; and
   outputting the test report.

2. The method according to claim 1, wherein the lifetime is a total erase count of the block.

3. The method according to claim 1, wherein the predetermined erase count is a fixed percentage of the lifetime.

4. The method according to claim 1, wherein the lifetime is input into a host system by a user.

5. The method according to claim 1, wherein the lifetime is obtained by a host system through an interface command between the host system and the solid-state storage medium.

6. The method according to claim 1 further comprising:
   obtaining an error correction code (ECC) endurance of each of the blocks;
   obtaining a bidden error according to the ECC endurance; and
   merging the hidden error of each of the blocks into the problematic block number to be the test report.

7. The method according to claim 6, wherein the ECC endurance is obtained by a host system through an interface command between the host system and the solid-state storage medium.

8. The Method according to claim 1, further comprising:
   obtaining an invalid page number of each of the blocks, and calculating a corresponding block number according to the invalid page number; and
   merging the block number corresponding to the invalid page number into the problematic block number to be the test report.

9. The method according to claim 8, wherein the invalid page number is obtained by a host system through an interface command between the host system and the solid-state storage medium.

10. A method for testing a reliability of a solid-state storage medium, wherein the solid-state storage medium comprises a plurality of blocks, the method comprising:
    determining a test process;
    sending a data of a test item to a host through an interface command by using the solid-state storage medium; and
    obtaining a data difference of the test item before and after the test process;
    calculating a ratio of the problematic block number to a total block number of the solid-state storage medium, and using the ratio as a test report; and
    outputting the test report,
    wherein the test item is to determine whether an erase count of each of the blocks is greater than a redetermined erase court and the step of sending the data of the test item further comprises:
    accumulating the blocks having the erase counts greater than the predetermined erase count to generate a problematic block number and outputting the test report.

11. The method according to claim 10, wherein the predetermined erase count is determined by a fixed percentage of a lifetime of each of the blocks.

12. The method according to claim 10, wherein the test item further comprises an invalid page, and the step of sending the data of the test item further comprises:
    obtaining an invalid page number of each of the blocks, and calculating a corresponding block number according to the invalid page number; and
    merging the block number into the problematic block number to be the test report.

13. The method according to claim 10, wherein the test item is an ECC endurance of each of the blocks.

14. The method according to claim 13, wherein the step of sending the data of the test item further comprises:
    obtaining the ECC endurance of each of the blocks,
    obtaining a hidden error according to the ECC endurance; and
    serving the hidden error of each of the blocks as the test report.

* * * * *